United States Patent
Yinn

(10) Patent No.: US 8,278,971 B2
(45) Date of Patent: *Oct. 2, 2012

(54) DETECTION CIRCUIT

(75) Inventor: Aung Aung Yinn, Sinshih Township, Tainan County (TW)

(73) Assignee: Himax Analogic, Inc., Tainan County (TW)

( * ) Notice: Subject to any disclaimer, the term of this patent is extended or adjusted under 35 U.S.C. 154(b) by 206 days.

This patent is subject to a terminal disclaimer.

(21) Appl. No.: 12/857,792

(22) Filed: Aug. 17, 2010

(65) Prior Publication Data

US 2012/0043995 A1    Feb. 23, 2012

(51) Int. Cl.
*H03K 5/24* (2006.01)
(52) U.S. Cl. ............... 327/77; 327/81; 327/103
(58) Field of Classification Search .............. 327/50–53, 327/56, 77, 78, 80, 81, 85, 88, 89, 103; 315/291, 315/297, 302, 307
See application file for complete search history.

(56) References Cited

U.S. PATENT DOCUMENTS

| 5,446,397 | A  | * | 8/1995 | Yotsuyanagi | 327/66 |
| 6,014,057 | A  | * | 1/2000 | Yuasa | 330/263 |
| 7,986,108 | B2 | * | 7/2011 | Yinn et al. | 315/297 |
| 2011/0043114 | A1 | * | 2/2011 | Hsu et al. | 315/119 |

* cited by examiner

*Primary Examiner* — Patrick O'Neill
(74) *Attorney, Agent, or Firm* — Thomas, Kayden, Horstemeyer & Risley, LLP

(57) ABSTRACT

A detection circuit is disclosed in specification and drawing, where the detection circuit includes a current source, a voltage-current converter and a current comparator. The voltage-current converter is configured to acquire a receiving current from the current source by comparing a reference voltage with an input voltage of a detecting terminal. The current comparator is configured to output an output voltage by comparing a steady current with an output current based on the receiving current.

10 Claims, 2 Drawing Sheets

DETECTION CIRCUIT

BACKGROUND

1. Technical Field

The present disclosure relates to circuitry, and more particularly, detection circuits.

2. Description of Related Art

A light-emitting diode (LED) is a semiconductor light source. LEDs are used as indicator lamps in many devices, and are increasingly used for lighting. Early LEDs emitted low-intensity red light, but modern versions are available across the visible, ultraviolet and infrared wavelengths, with very high brightness.

It is common that only a part of the LED channels are used in multi-channel LED applications. For example, it is possible that only five channels are connected in a 6-channel LED driver IC. However, if some but not all channels of the driver IC are connected to LEDs, the driver IC will function unstably when performing open detection, which is unfavorable to circuit design.

SUMMARY

The following presents a simplified summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later.

In one or more various aspects, the present disclosure is directed to a detection circuit. The detection circuit may be easily inserted into existing LED drivers, and may be applicable or readily adaptable to all technology. In use, the detection circuits can be utilized for LED open detection.

According to one embodiment of the present invention, a detection circuit includes a current source, a voltage-current converter and a current comparator. The voltage-current converter is configured to acquire a receiving current from the current source by comparing a reference voltage with an input voltage of a detecting terminal. The current comparator is configured to output an output voltage by comparing a steady current with an output current based on the receiving current.

When the detecting terminal is opened, the input voltage is essentially equal to the reference voltage, and therefore the receiving current is relatively low so that the output voltage is a relatively low voltage. On the contrary, when the detecting terminal is electrically connected to an input terminal of an LED, the input voltage is greater than the reference voltage, and therefore the receiving current is relatively high so that the output voltage is a relatively high voltage.

Many of the attendant features will be more readily appreciated, as the same becomes better understood by reference to the following detailed description considered in connection with the accompanying drawings.

BRIEF DESCRIPTION OF THE DRAWINGS

The present description will be better understood from the following detailed description read in light of the accompanying drawing, wherein.

DETAILED DESCRIPTION

Figure 1:
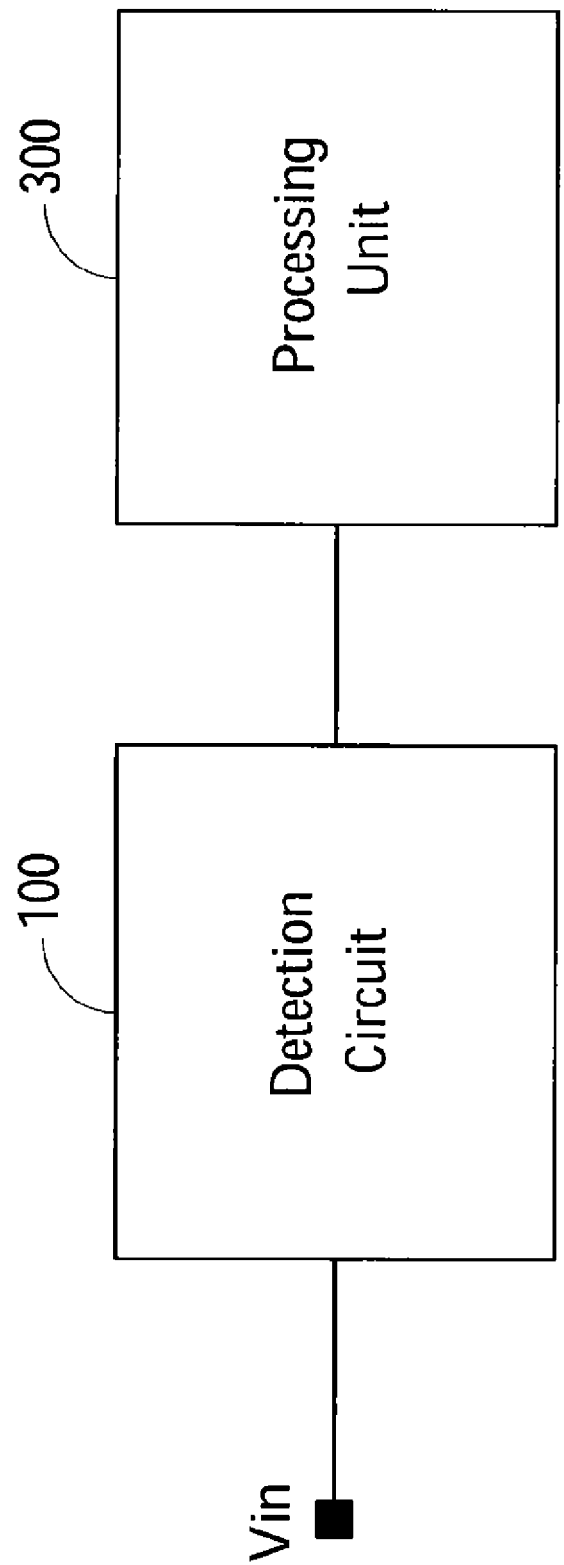
FIG. 1 is a block diagram of a LED driver according to the present disclosure.

In the following detailed description, for purposes of explanation, numerous specific details are set forth in order to attain a thorough understanding of the disclosed embodiments. It will be apparent, however, that one or more embodiments may be practiced without these specific details. In other instances, well-known structures and devices are schematically shown in order to simplify the drawing.

As used in the description herein and throughout the claims that follow, the meaning of "a", "an", and "the" includes reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to. As used in the description herein and throughout the claims that follow, the meaning of "in" includes "in" and "on" unless the context clearly dictates otherwise.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As shown in FIG. 1, the LED driver includes a detection circuit 100. The detection circuit 100 can detect an input voltage (VIN) of a detecting terminal to output a detection result. The processing unit 300 can determine whether the detecting terminal is opened according to the detection result.

In this embodiment, the processing unit 300 and the detection circuit 100 can be integrated into the LED driver. In another embodiment, the processing unit 300 can be configured in the detection circuit 100. In yet another embodiment, the processing unit 300 may be an external device and is electrically connected to the detection circuit 100. Those with ordinary skill in the art may flexibly dispose the processing unit depending on the desired application. In practice, the processing unit 300 may be hardware, software, firmware, and/or some combination of hardware, software, and/or firmware.

Figure 2:
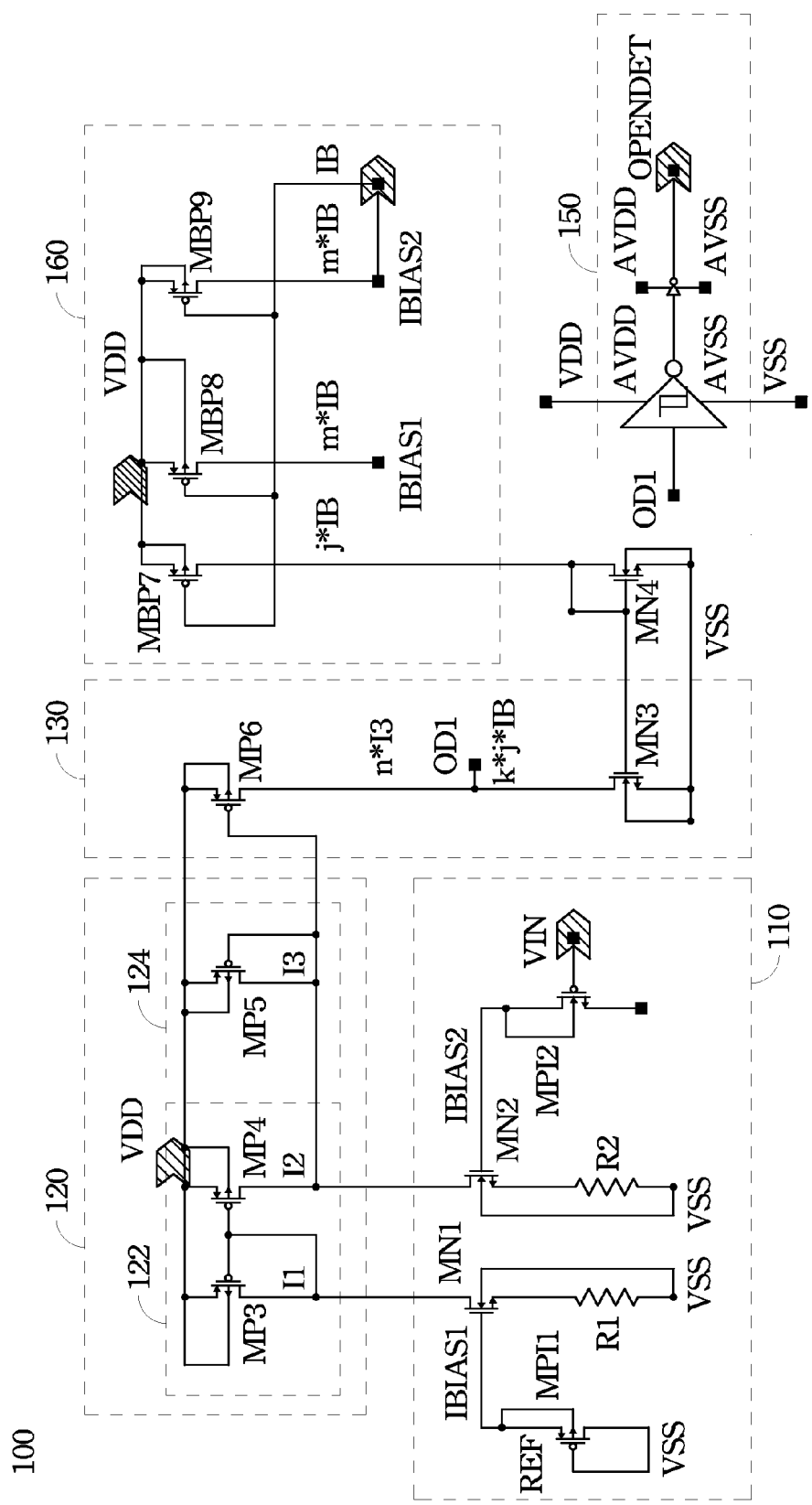
FIG. 2 is a circuit diagram of a detection circuit of FIG. 1 according to one embodiment of the present disclosure.

Please refer to FIG. 2. FIG. 2 is a circuit diagram of the detection circuit 100 according to one embodiment of the present invention. As shown in FIG. 2, the detection circuit 100 includes a voltage-current converter 110, a current source 120 and a current comparator 130. The voltage-current converter 110 is configured to acquire a receiving current (I3) from the current source 120 by comparing a reference voltage (VSS) with an input voltage (VIN) of a detecting terminal. The current comparator 130 is configured to output an output voltage via a voltage output terminal (OD1) by comparing a steady current (k*j*IB) with an output current (n*I3) based on the receiving current (I3).

When the detecting terminal is opened, the input voltage (VIN) is essentially equal to the reference voltage (VSS), and therefore the receiving current (I3) is relatively low, e.g. zero current, so that the output voltage is a relatively low voltage. On the contrary, when the detecting terminal is electrically connected to an input terminal of an LED, the input voltage (VIN) is greater than the reference voltage (VSS), and therefore the receiving current (I3) is relatively high so that the output voltage is a relatively high voltage.

Furthermore, the detection circuit 100 includes a trigger circuit 150. The trigger circuit 150 is electrically connected to the voltage output terminal (OD1) of the current comparator 130. In use, the trigger circuit 150 is configured to output a first logic level based on the relatively high voltage and to output a second logic level based on the relatively low voltage. In this embodiment, the first logic level is logic 1, and the second logic level is logic 0; alternatively, in another embodiment, the first logic level is logic 0, and the second logic level is logic 1.

In one or more embodiments, the processing unit 300 (shown in FIG. 1) can be configured in the detection circuit 100 and is connected to the output terminal (OPENDET) of the trigger circuit 150. Therefore, when receiving the first logic level, the processing unit 300 determines that the detecting terminal is electrically connected to the input terminal of a LED; when receiving the second logic level, the processing unit 300 determines that the detecting terminal is opened or is disconnected from the input terminal of the LED.

The current source 120 includes a first current mirror 122 and a current supply circuit 124. The first current mirror 122 is configured to provide a first current (I1) and a second current (I2) into the voltage-current converter 110. The current supply circuit 124 is configured to provide a third current (I3), i.e. aforesaid receiving current (I3), into the voltage-current converter 110.

The voltage-current converter 110 includes a first PMOS (MPI1), a first NMOS (MN1), a second PMOS (MPI2) and a second NMOS (MN2). The first PMOS (MPI1) is configured to receive the reference voltage (VSS). The first NMOS (MN1) is connected to the first PMOS (MPI1) for acquiring the first current (I1) responsive to the reference voltage (VSS). The second PMOS (MPI2) is connected to the detecting terminal. The second NMOS (MN2) is connected to the second PMOS (MPI2) for acquiring the second current (I2) and third current (I3) responsive to the input voltage (VIN) of the detecting terminal. In this way, the second current (I2) plus the third current (I3) essentially equal to the first current (I1).

When the detecting terminal is electrically connected to the input terminal of an LED, the input voltage (VIN) is greater than the reference voltage (VSS); therefore, the first current (I1) is greater than the second current (I2), and the third current (I3) is greater than a zero current, so that the output voltage of the voltage output terminal (OD1) is a relatively high voltage. On the contrary, when the input voltage (VIN) is essentially equal to the reference voltage (VSS), the detecting terminal is opened; therefore, the first current (I1) is essentially equal to the second current (I2), and the third current (I3) is essentially a zero current, so that the output voltage of the voltage output terminal (OD1) is a relatively low voltage.

In this embodiment, the drain of first PMOS (MPI1) is connected to the gate of first PMOS (MPI1), so that the negative supply voltage (VSS) serves as aforesaid reference voltage that is applied to the gate of first PMOS (MPI1). In the alternative embodiment, the drain of first PMOS is disconnected from the gate of first PMOS, and an additional reference voltage is applied to the gate of first PMOS.

The voltage-current converter 110 may include a first current-limiting resistor (R1) and a second current-limiting resistor (R2). The first current-limiting resistor (R1) is connected to the first NMOS (MN1). The second current-limiting resistor (R2) is connected to the second NMOS (MN2).

The first current mirror 122 includes a third PMOS (MP3) and a fourth PMOS (MP4). The third PMOS (MP3) is configured to provide the first current (I1) into the first NMOS (MN1). The fourth PMOS (MP4) is configured to provide the second current (I2) into the second NMOS (MN2).

The current supply circuit 124 includes a fifth PMOS (MP5). The fifth PMOS (MP5) is configured to provide the third current (I3) that is greater than a zero current when the first current (I1) is greater than the second current (I2).

The current comparator 130 includes a sixth PMOS (MP6) and a third NMOS (MN3). The sixth PMOS (MP6) and the fifth PMOS (MP5) constitutes a second current mirror, so that the sixth PMOS (MP6) is configured to provide the output current (n*I3) that is directly related to the third current (I3), i.e. aforesaid receiving current. The third NMOS (MN3) is configured to provide the steady current (k*j*IB) and is connected to the sixth PMOS (MP6) via the voltage output terminal (OD1) that outputs the output voltage.

Furthermore, a current bias circuit 160 is connected to a fourth NMOS (MN4). The fourth NMOS (MN4) is coupled with the third NMOS (MN3) to constitute a third current mirror. In use, the current bias circuit 160 provides a reference current (j*IB) into the fourth NMOS (MN4), so that the third NMOS (MN3) is configured to provide the steady current (k*j*IB) that is directly related to the reference current (j*IB).

The current bias circuit 160 includes a seventh PMOS (MBP7), an eighth PMOS (MBP8) and a ninth PMOS (MBP9). The seventh PMOS (MBP7) is configured to provide the reference current (j*IB) into the fourth NMOS (MN4). The eighth PMOS (MBP8) is configured to provide a first bias current (IBIAS1) for the first PMOS (MPI1) of the voltage-current converter 110. The ninth PMOS (MBP9) is configured to provide a second bias current (IBIAS2) for the second PMOS (MPI2) of the voltage-current converter 110.

The reader's attention is directed to all papers and documents which are filed concurrently with his specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph.

What is claimed is:

1. A detection circuit comprising:
   a current source;
   a voltage-current converter, coupled to the current source and a reference voltage, the voltage-current converter configured to acquire a receiving current from the current source by comparing the reference voltage with an input voltage of a detecting terminal, wherein the current source comprises: a first current mirror configured to provide a first current and a second current into the voltage-current converter; and a current supply circuit configured to provide a third current being the receiving current into the voltage-current converter, wherein the voltage-current converter comprises: a first PMOS configured to receive the reference voltage; a first NMOS connected to the first PMOS for acquiring the first current responsive to the reference voltage; a second PMOS connected to the detecting terminal; and a second NMOS connected to the second PMOS for acquiring the second and third currents responsive to the input voltage of the detecting terminal, wherein the second current plus the third current essentially equal to the first current, wherein the voltage-current converter further comprises: a first current-limiting resistor coupled to the first NMOS; and a second current-limiting resistor coupled to the second NMOS; and
   a current comparator, coupled to the current source, the voltage-current converter and a steady current, the current comparator configured to output an output voltage by comparing the steady current with an output current based on the receiving current.

2. The detection circuit of claim 1, wherein when the input voltage is greater than the reference voltage, the receiving current is relatively high so that the output voltage is a relatively high voltage; when the input voltage is essentially equal to the reference voltage, the receiving current is relatively low so that the output voltage is a relatively low voltage.

3. The detection circuit of claim 2, further comprising:
   a trigger circuit, coupled to the current comparator, the trigger circuit configured to output a first logic level based on the relatively high voltage or to output a second logic level based on the relatively low voltage.

4. The detection circuit of claim 1, wherein when the input voltage is greater than the reference voltage, the first current is greater than the second current so that the output voltage is a relatively high voltage; when the input voltage is essentially equal to the reference voltage, the first current is essentially equal to the second current so that the output voltage is a relatively low voltage.

5. The detection circuit of claim 4, further comprising:
   a trigger circuit, coupled to the current comparator, the trigger circuit configured to output a first logic level based on the relatively high voltage or to output a second logic level based on the relatively low voltage.

6. The detection circuit of claim 1, wherein the first current mirror comprises:
   a third PMOS configured to provide the first current into the first NMOS; and
   a fourth PMOS configured to provide the second current into the second NMOS.

7. The detection circuit of claim 6, wherein the current supply circuit comprises:
   a fifth PMOS configured to provide the third current when the first current is greater than the second current.

8. The detection circuit of claim 7, wherein the current comparator comprises:
   a sixth PMOS is configured to provide the output current, wherein the sixth PMOS and the fifth PMOS constitutes a second current mirror; and
   a third NMOS configured to provide the steady current and connected to the sixth PMOS via a voltage output terminal that outputs the output voltage.

9. A detection circuit, comprising:
   a current source;
   a voltage-current converter, coupled to the current source and a reference voltage, the voltage-current converter configured to acquire a receiving current from the current source by comparing the reference voltage with an input voltage of a detecting terminal, wherein the current source comprises: a first current mirror configured to provide a first current and a second current into the voltage-current converter; and a current supply circuit configured to provide a third current being the receiving current into the voltage-current converter, wherein the voltage-current converter comprises: a first PMOS configured to receive the reference voltage; a first NMOS connected to the first PMOS for acquiring the first current responsive to the reference voltage; a second PMOS connected to the detecting terminal; and a second NMOS connected to the second PMOS for acquiring the second and third currents responsive to the input voltage of the detecting terminal, wherein the second current plus the third current essentially equal to the first current, wherein the first current mirror comprises: a third PMOS configured to provide the first current into the first NMOS; and a fourth PMOS configured to provide the second current into the second NMOS, wherein the current supply circuit comprises: a fifth PMOS configured to provide the third current when the first current is greater than the second current;
   a current comparator, coupled to the current source, the voltage-current converter and a steady current, the current comparator configured to output an output voltage by comparing the steady current with an output current based on the receiving current, wherein the current comparator comprises: a sixth PMOS is configured to provide the output current, wherein the sixth PMOS and the fifth PMOS constitutes a second current mirror; and a third NMOS configured to provide the steady current and connected to the sixth PMOS via a voltage output terminal that outputs the output voltage;
   a fourth NMOS coupled with the third NMOS to constitute a third current mirror; and
   a current bias circuit for providing a reference current into the fourth NMOS, so that the third NMOS provides the steady current directly related to the reference current.

10. The detection circuit of claim 9, wherein the current bias circuit comprises:
    a seventh PMOS configured to provide the reference current into the fourth NMOS;
    an eighth PMOS configured to provide a first bias current for the first PMOS; and
    a ninth PMOS configured to provide a second bias current for the second PMOS.

* * * * *